US008848451B2

(12) United States Patent
Kim et al.

(10) Patent No.: US 8,848,451 B2
(45) Date of Patent: Sep. 30, 2014

(54) 3D SEMICONDUCTOR MEMORY DEVICE

(75) Inventors: Jung-soo Kim, Yongin-si (KR); Sang-wan Nam, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 164 days.

(21) Appl. No.: 13/526,896

(22) Filed: Jun. 19, 2012

(65) Prior Publication Data

US 2013/0028027 A1 Jan. 31, 2013

(30) Foreign Application Priority Data

Jul. 25, 2011 (KR) .......................... 10-2011-0073780

(51) Int. Cl.
*G11C 16/04* (2006.01)
*G11C 16/34* (2006.01)
*G11C 16/06* (2006.01)

(52) U.S. Cl.
CPC .............. *G11C 16/344* (2013.01); *G11C 16/06* (2013.01); *G11C 16/0483* (2013.01)
USPC .................................................... 365/185.22

(58) Field of Classification Search
CPC ............................ G11C 16/04; G11C 16/0483
USPC .................................................... 365/185.22
See application file for complete search history.

(56) References Cited

U.S. PATENT DOCUMENTS

| 7,009,889 | B2 | 3/2006 | Tran et al. | |
|---|---|---|---|---|
| 2009/0296466 | A1* | 12/2009 | Kim et al. | 365/185.03 |
| 2010/0008150 | A1 | 1/2010 | Hazama | |
| 2010/0172185 | A1* | 7/2010 | Kim | 365/185.19 |
| 2010/0202183 | A1* | 8/2010 | Kurjanowicz | 365/94 |
| 2011/0249498 | A1* | 10/2011 | Tokiwa et al. | 365/185.05 |
| 2012/0051136 | A1* | 3/2012 | Kang et al. | 365/185.17 |
| 2012/0051138 | A1* | 3/2012 | Kim et al. | 365/185.17 |
| 2013/0069152 | A1* | 3/2013 | Lee et al. | 257/335 |
| 2013/0248974 | A1* | 9/2013 | Alsmeier et al. | 257/321 |

FOREIGN PATENT DOCUMENTS

| JP | 2010-20814 | 1/2010 |
|---|---|---|
| KR | 10-2009-0074431 | 7/2009 |

* cited by examiner

*Primary Examiner* — Hoai V Ho
*Assistant Examiner* — Min Huang
(74) *Attorney, Agent, or Firm* — Onello & Mello, LLP

(57) ABSTRACT

A 3D semiconductor memory device including a plurality of memory cell strings, includes a substrate and a channel that extends from the substrate. Memory cells may be disposed in layers in which the diameter of the channel varies. A programming verification operation may be carried out in a sequence whereby memory cells more likely to fail in programming are verified before attempting to verify memory cells that are less likely to fail programming. In an exemplary embodiment, the verification operation is performed on a memory cell disposed in a layer associated with a larger-diameter channel before performing the verification on a memory cell disposed in a layer associated with a smaller-diameter channel. In an exemplary embodiment, if a verification process detects a programming failure, the verification of subsequent memory cells is cancelled.

19 Claims, 13 Drawing Sheets

3D SEMICONDUCTOR MEMORY DEVICE

CROSS-REFERENCE TO RELATED APPLICATIONS

This application claims the benefit of Korean Patent Application No. 10-2011-0073780, filed on Jul. 25, 2011, in the Korean Intellectual Property Office, the disclosure of which is incorporated herein in its entirety by reference.

BACKGROUND

Methods and apparatuses in accordance with principles of inventive concepts relate to a 3D semiconductor memory device, and more particularly, to a 3D semiconductor memory device including a vertical non-volatile memory device.

Various approaches to increasing the capacity of integrated circuit memory devices have been attempted. An apparatus and method that vertically stacks cell transistors of a non-volatile memory device, such as a flash memory device, while providing high speed operation would be particularly desirable.

SUMMARY

According to an aspect of inventive concepts, there is provided a 3D semiconductor memory device including a plurality of memory cell strings; the the 3D semiconductor memory device includes a substrate; a first channel that extends from the substrate in a direction that is transverse the substrate; a first memory cell that is disposed in a first layer of the first channel; a second memory cell that is disposed in a second layer of the first channel; and a controller that controls the first memory cell and the second memory cell, wherein the controller performs a first step of applying a verifying voltage to the first memory cell disposed in the first layer and a second step of applying a verifying voltage to the second memory cell disposed in the second layer, a first diameter of the first channel disposed in the first layer is greater than a second diameter of the first channel disposed in the second layer, and the second step is performed only when the verifying operation of the first step is passed. The second layer may be disposed between the first layer and the substrate.

In an exemplary embodiment in accordance with principles of inventive concepts first and second steps may be performed after performing erase operations of the first and second memory cells. The erase operation may include applying an erase voltage to the first and second memory cells before the first and second steps.

In an exemplary embodiment in accordance with principles of inventive concepts, a 3D semiconductor memory device may further include: a third memory cell that is disposed in a third layer of the first channel; and a fourth memory cell that is disposed in a fourth layer of the first channel, wherein the first channel includes a upper channel and a lower channel disposed between the upper channel and the substrate, the first and second layers are disposed in the upper channel, the third and fourth layers are disposed in the lower channel, the controller performs a third step of applying a verifying voltage to the third memory cell disposed in the third layer, and a fourth step of applying a verifying voltage to the fourth memory cell disposed in the fourth layer, a third diameter of the lower channel disposed in the third layer is greater than a fourth diameter of the lower channel disposed in the fourth layer, and the fourth step is performed after the third step. The fourth layer may be disposed between the third layer and the substrate, for example.

In an exemplary embodiment in accordance with principles of inventive concepts, the controller may sequentially perform the first step and the third step, or the third step and the first step, and then perform the second step and the fourth step.

In an exemplary embodiment in accordance with principles of inventive concepts, the controller simultaneously may perform the first step and the third step, and then the second step and the fourth step. In such an exemplary embodiment, the first diameter may be substantially the same as the third diameter, and the second diameter is substantially the same as the fourth diameter In an exemplary embodiment in accordance with principles of inventive concepts, the 3D semiconductor memory device may further include: a second channel that extends from the substrate in a direction that is transverse the substrate; a fifth memory cell that is disposed in the first layer of the second channel; and a sixth memory cell that is disposed in the second layer of the second channel, wherein the controller performs a fifth step of applying a verifying voltage to the fifth memory cell disposed in the first layer, and a sixth step of applying a verifying voltage to the sixth memory cell disposed in the second layer, a fifth diameter of the second channel disposed in the first layer is greater than a sixth diameter of the second channel disposed in the second layer, and the sixth step is performed after the fifth step.

In an exemplary embodiment in accordance with principles of inventive concepts, a 3D semiconductor memory device may further include: a first word line that is connected to the first memory cell and the fifth memory cell; a second word line that is connected to the second memory cell and the sixth memory cell; a first selection transistor that is connected to the first channel; and a second selection transistor that is connected to the second channel.

In an exemplary embodiment in accordance with principles of inventive concepts, the controller may sequentially perform the first step, the second step, the fifth step, and the sixth step. In this case, the first and second steps are performed by turning on the first selection transistor, and applying a verifying voltage to the first and second word lines, and the fifth and sixth steps are sequentially performed by turning on the second selection transistor and applying a verifying voltage to the first and second word lines.

In an exemplary embodiment in accordance with principles of inventive concepts, the controller may sequentially perform the first step, the fifth step, the second step, and the sixth step. In such an exemplary embodiment, the first and fifth steps may be performed by applying a verifying voltage to the first word line, and sequentially turning on the first selection transistor and the second selection transistor, and the second and sixth steps may be performed by applying a verifying voltage to the second word line, and sequentially turning on the first selection transistor and the second selection transistor.

In an exemplary embodiment in accordance with principles of inventive concepts, there is provided a 3D semiconductor memory device including a plurality of memory cell strings; the 3D semiconductor memory device including: a substrate; a first channel that extends from the substrate in a direction that is transverse the substrate; a first memory cell that is disposed in a first layer of the first channel; a second memory cell that is disposed in a second layer of the first channel; and a controller that controls the first memory cell and the second memory cell, wherein the controller performs a first step of applying a verifying voltage to the first memory cell disposed in the first layer and a second step of applying a verifying voltage to the second memory cell disposed in the second layer, the second layer is disposed between the first layer and the substrate, and the second step is performed after the first step.

In an exemplary embodiment in accordance with principles of inventive concepts, a method in a semiconductor memory may include verifying a programming step in a memory cell in which the programming step is more likely to have failed and subsequently verifying the programming step in a memory cell in which the programming step was less likely to have failed.

In an exemplary embodiment in accordance with principles of inventive concepts, the semiconductor memory is a 3D semiconductor memory device including a plurality of memory cell strings, the 3D memory device including: a substrate; a first channel that extends from the substrate in a direction that is transverse the substrate; a first memory cell that is disposed in a first layer of the first channel; a second memory cell that is disposed in a second layer of the first channel, wherein a first diameter of the first channel disposed in the first layer is greater than a second diameter of the first channel disposed in the second layer, and the verifying of a programming step is performed on a memory cell in the first layer before a memory cell in the second layer.

In an exemplary embodiment in accordance with principles of inventive concepts, the verifying of a programming step is the verifying of an erasing step.

In an exemplary embodiment in accordance with principles of inventive concepts, the verifying of a memory cell in the second layer is not performed if the verifying of a memory cell in the first layer indicates the programming of the memory cell in the first layer is a failure.

In an exemplary embodiment in accordance with principles of inventive concepts, the step of verifying is performed on a 3D FLASH memory device.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
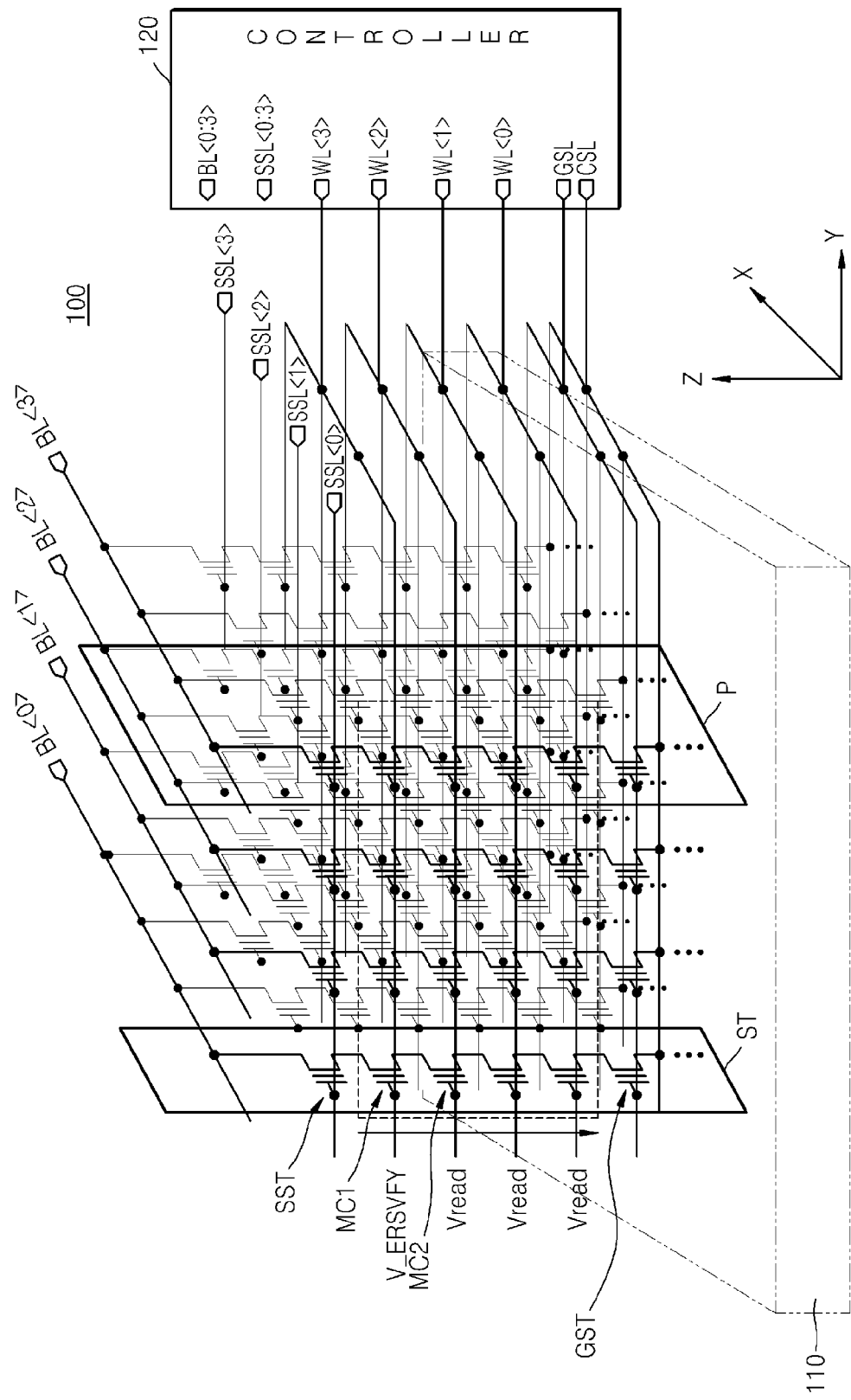
FIG. 1 is a circuit diagram schematically illustrating an exemplary embodiment of a 3D semiconductor memory device in accordance with principles of inventive concepts.

Exemplary embodiments of the inventive concepts will now be described more fully with reference to the accompanying drawings, in which exemplary embodiments of the inventive concept are shown. Exemplary embodiments of the inventive concept may, however, be embodied in many different forms and should not be construed as limited to the embodiments set forth herein; rather, these exemplary embodiments of the inventive concept are provided so that this description will be thorough and complete, and will fully convey the concept of exemplary embodiments of the inventive concept to those of ordinary skill in the art. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated, for example, 90 degrees or at other orientations) and the spatially relative descriptors used herein interpreted accordingly.

The terminology used herein is for the purpose of describing particular exemplary embodiments of the inventive concept only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the inventive concept are described herein with reference to cross-sectional illustrations that are schematic illustrations of idealized exemplary embodiments of the inventive concept (and intermediate structures). As such, variations from the shapes of the illustrations as a result, for example, of manufacturing techniques and/or tolerances, are to be expected. Thus, exemplary embodiments of the inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The terms "film" and "layer" may be used interchangeably herein.

FIG. 1 is a circuit diagram schematically illustrating an exemplary embodiment of a 3D semiconductor memory device 100 in accordance with principles of inventive concepts.

Referring to FIG. 1, 3D semiconductor memory device 100 includes a substrate 110, a plurality of memory cell strings ST, word lines WL<0> to WL<3>, bit lines BL<0> to BL<3>, and a controller 120.

Memory cell strings ST are aligned between bit lines BL<0> to BL<3> and a common source line CSL in a matrix of 4 rows in an x-direction and 4 columns in a y-direction on substrate 110 in this exemplary embodiment. Memory cell strings ST may extend from substrate 110 in a protruding direction thereof, for example, a z-direction perpendicular to substrate 110, or in a vertical direction or in a direction that is transverse the horizontal direction of extension of the substrate. In an exemplary embodiment in accordance with principles of inventive concepts, each memory cell string ST may include 4 memory cells MC along the z-direction, a source selection transistor SST, and a ground selection transistor GST. Source selection transistor SST may be connected to source selection lines SSL<0> to SSL<3> extending in the y-direction and may be controlled, and ground selection transistor GST may be connected to a ground selection line GSL extending in the x- and y-directions and may be controlled. Hereinafter, memory cells MC contained in memory cell strings ST aligned in a matrix of 4 rows in the x-direction and 4 columns in the y-direction may be referred to as a 'block'.

In an exemplary embodiment in accordance with principles of inventive concepts, four word lines WL<0> to WL<3> are aligned in the z-direction perpendicular to substrate 110. Each word line WL<0> to WL<3> is disposed in one of the four layers in the z-direction where the memory cells MC of one of memory cell strings ST are respectively disposed. Each word line WL<0> to WL<3> is connected to memory cells MC aligned on substrate 110 in a matrix of 4 rows in the x-direction and 4 columns in the y-direction. Bit lines BL<0> to BL<3> may be connected to the memory cell strings ST aligned in the x-direction.

Controller 120 may perform a programming operation and/or a verifying operation on the memory cells MC by applying controlled voltages to word lines WL<0> to WL<3> and bit lines BL<0> to BL<3>. In particular, controller 120 may select one of the memory cell strings ST by applying a controlled voltage to source selection lines SSL<0> to SSL<3> connected to source selection transistor SST and bit lines BL<0> to BL<3>, and select one of the memory cells MC in the selected memory cell string ST by applying a controlled voltage to word lines WL<0> to WL<3>. Thus, a programming operation and/or verifying operation may be performed in the selected memory cell MC.

Memory cells MC, source selection transistor SST, and ground selection transistor GST of the memory cell string ST may share the same channel. The channel may extend from substrate 110 in the z-direction perpendicular to substrate 110. For example, the channel may have a channel last structure, such as bit-cost scalable (BiCS) structure, in which a channel is formed after a gate and an insulating layer are formed, or a channel first structure, such as terabit cell array transistor (TCAT) structure, in which a channel is foamed, and then a gate and an insulating layer are formed.

In an exemplary embodiment in accordance with principles of inventive concepts, a controller may perform a verification step after an erase step and, in order to accelerate the process, the sequence of verification steps may be carried out in an order that verifies the most-likely-to err cells first. As will be described in greater detail in the discussion related to the following figures, features within upper layers of a memory may render those layers more susceptible to errors than lower layers. And, therefore, in accordance with principles of inventive concepts, upper layers of memory may be verified, after an erase operation for example, before lower layers are verified.

In an exemplary memory cell string ST in accordance with principles of inventive concepts, a first memory cell MC1 may be disposed in a first layer of a first channel, and a second memory cell MC2 may be disposed in a second layer of the first channel, under the first layer of the first channel, between the first layer and substrate 110. In such an exemplary embodiment, controller 120 may verify the contents of the upper, first, memory cell MC1 before verifying the contents of the lower, second, memory cell MC2. The verification process may be performed, for example, after a programming operation, such as an erase operation, whereby the contents of memory cells MC1 and MC2 are to be erased. As will be described in greater detail in the discussion related to the following figures, features of upper-level memory cells (that is, cells farther from substrate 110) may render them more susceptible to erasure errors than lower-level memory cells (that is, cells closer to substrate 110). By verifying those cells that are more likely to be in error first, a memory in accordance with principles of inventive concepts may operate more rapidly than memories that perform a verification process in another manner.

A verification operation in accordance with principles of inventive concepts (employing, for example, a first step of erasing memory cell contents and a second step of verifying the memory cell contents) of controller 120 may increase operation speed. Upper-level memory cells may be more susceptible to error because, in general, the diameter of a hole, of the channel connected to a upper word line, for example, WL<3>, is greater than that of the channel connected to a lower word line, for example, WL<2>. As the width of the channel increases, an electric field (E-field) applied to a tunneling oxide layer between the word line and the channel decreases. As the electric field decreases, charges stored in a charge storage layer may not be discharged. In this manner, an erase operation may not be properly performed. And, as a result, an 'erase failure' may more often occur in the channel connected to an upper word line, for example, WL<3>, than in the channel connected to the lower word line, for example, WL<2>.

If a verification operation were to be performed by applying a verifying voltage in the numerical order of the word lines, i.e., from the lower word line to the upper word line corresponding to a numerical order from WL<0> to WL<3>, the highest probability of detecting an erase failure would lie in the upper-level layers and, as a result, a verification operation would require more time than a verification operation in accordance with principles of inventive concepts. That is, in an exemplary 3D semiconductor memory device 100 in accordance with principles of inventive concepts, a verification operation may be performed by applying the verifying voltage in reverse order of the word line, that is, from WL<3> to WL<0>, in other words, from the upper word line, for example, WL<3>, to the lower word line, for example, WL<2>; that is, in sequence from higher probability of erase-failure to lower probability of erase failure. Accordingly, in 3D semiconductor memory device 100, the verifying operation is first performed on a word line connected to the channel having a large width (an upper word line in this exemplary embodiment), so that the erase failure may be quickly detected to increase the operation speed.

Figure 2:
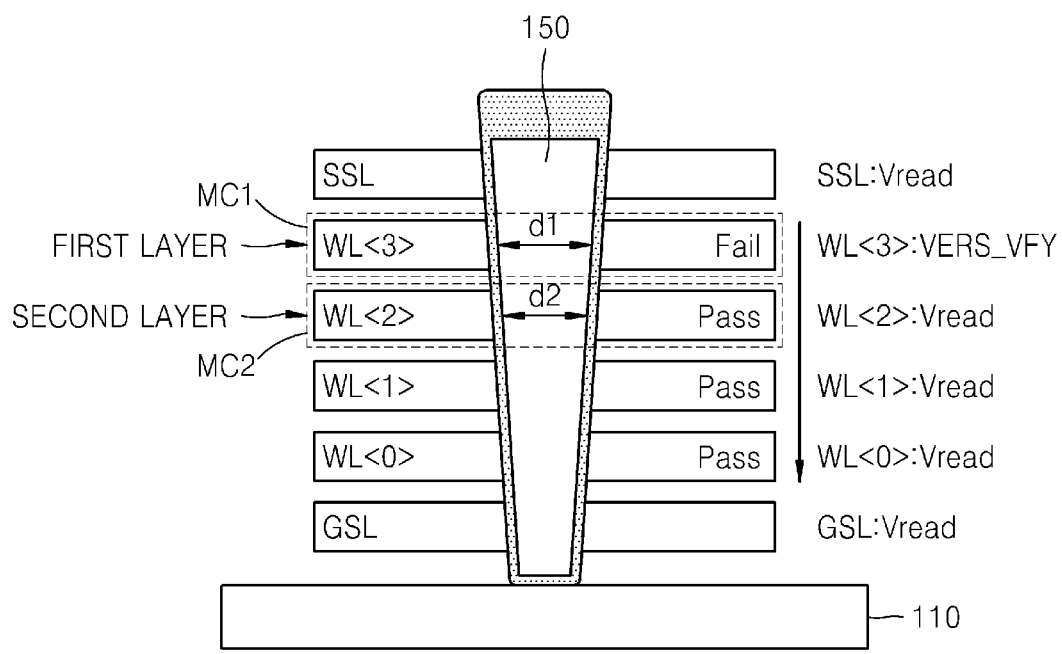
FIG. 2 is a cross-sectional view of a first portion of FIG. 1.
Figure 3:
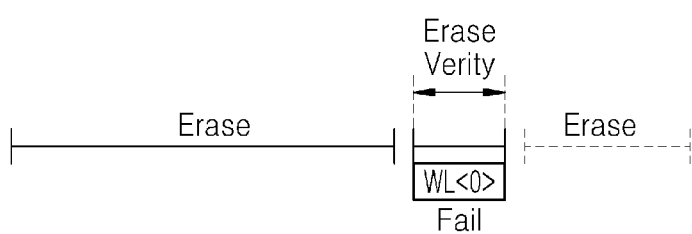
FIG. 3 is a timeline diagram illustrating an exemplary embodiment of a verifying operation of a 3D semiconductor memory device in accordance with principles of inventive concepts.

FIG. 2 is a cross-sectional view of an exemplary embodiment of a memory cell string ST that is a first portion, of FIG. 1. The timeline of FIG. 3 illustrates an exemplary embodiment of a verification operation of a 3D semiconductor memory device 100 in accordance with principles of inventive concepts.

In this exemplary embodiment first diameter d1 of channel 150 disposed in a first layer may be greater than second diameter d2 of channel 150 disposed in a second layer. In this case, controller 120 (FIG. 1) may perform a first step of applying a verifying voltage to a first memory cell MC1 disposed in the first layer, and then perform a second step of applying a verifying voltage to second memory cell MC2 disposed in the second layer in order to determine whether an erase operation is properly performed.

As previously described, an erase operation may be more effective in second memory cell MC2 connected to second word line WL<2> and memory cells connected to lower word lines WL<1> and WL<0> than in first memory cell MC1 connected to the first word line WL<3>, because first diameter d1 of channel 150 of first memory cell MC1 disposed in the first layer is greater than diameters of the other memory cells, as described above.

Controller 120 (FIG. 1) of 3D semiconductor memory device in accordance with principles of inventive concepts may verify a normal erase operation in the first memory cell MC1 by applying a verifying voltage to the first memory cell MC1 connected to the first word line WL<3>, and then verify a normal erase operation in the second memory cell MC2 by applying a verifying voltage to the second memory cell MC2 connected to the second word line WL<2>. Accordingly, when the erase operation is not normally performed in the first memory cell MC1, that is, when there is an erase failure, controller 120 (FIG. 1) may quickly detect such a failure.

Figure 4:
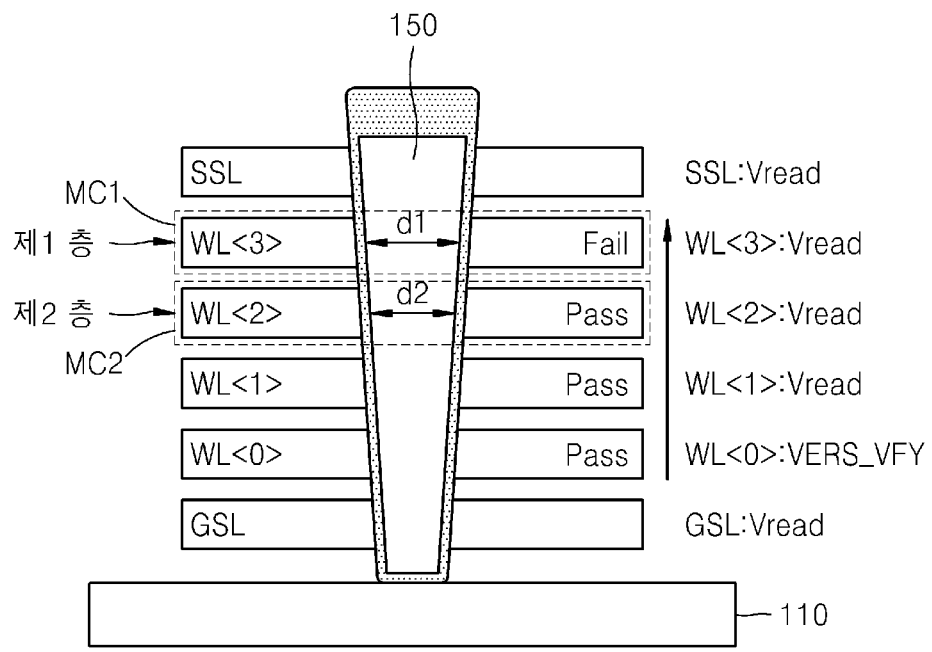
FIG. 4 is a cross-sectional view of a semiconductor device corresponding to FIG. 2.
Figure 5:
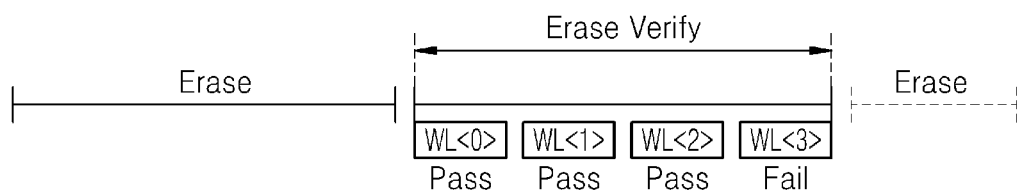
FIG. 5 is a timeline diagram illustrating an exemplary embodiment of a verifying operation of a 3D semiconductor memory device corresponding to FIG. 3.

In contrast, in an example described with reference to FIGS. 4 and 5, a general verifying operation may be performed by applying the verifying voltage in the numerical order of the word lines, that is, from the lower word line to the upper word line, that is, from WL<0> to WL<3>, after an erase operation. In a conventional operation such as this, the controller performs a step of applying a verifying voltage to a memory cell connected to a lower word line, for example, WL<2>, and then performs a step of applying a verifying voltage to a memory cell connected to a upper word line, for example, WL<3>, in order to determine whether the erase operation is properly performed. In a conventional process such as this, it would take longer to determine an erase failure in a memory cell in which an erase failure is more likely to occur, in first memory cell MC1.

Although, in an exemplary embodiment in accordance with principles of inventive concepts, a verification operation is performed after an erase operation, the inventive concept is not limited thereto. For example, a verification operation in accordance with principles of inventive concepts, one that proceeds from more-likely to fail to less likely to fail memory cells (for example, from a cell associated with an upper word line to a cell associated with a lower word line), may also be applied not only to an erase operation but also to any programming operation. In other words, a verification process in accordance with principles of inventive concepts may be applied to any programming operation.

Figure 6:
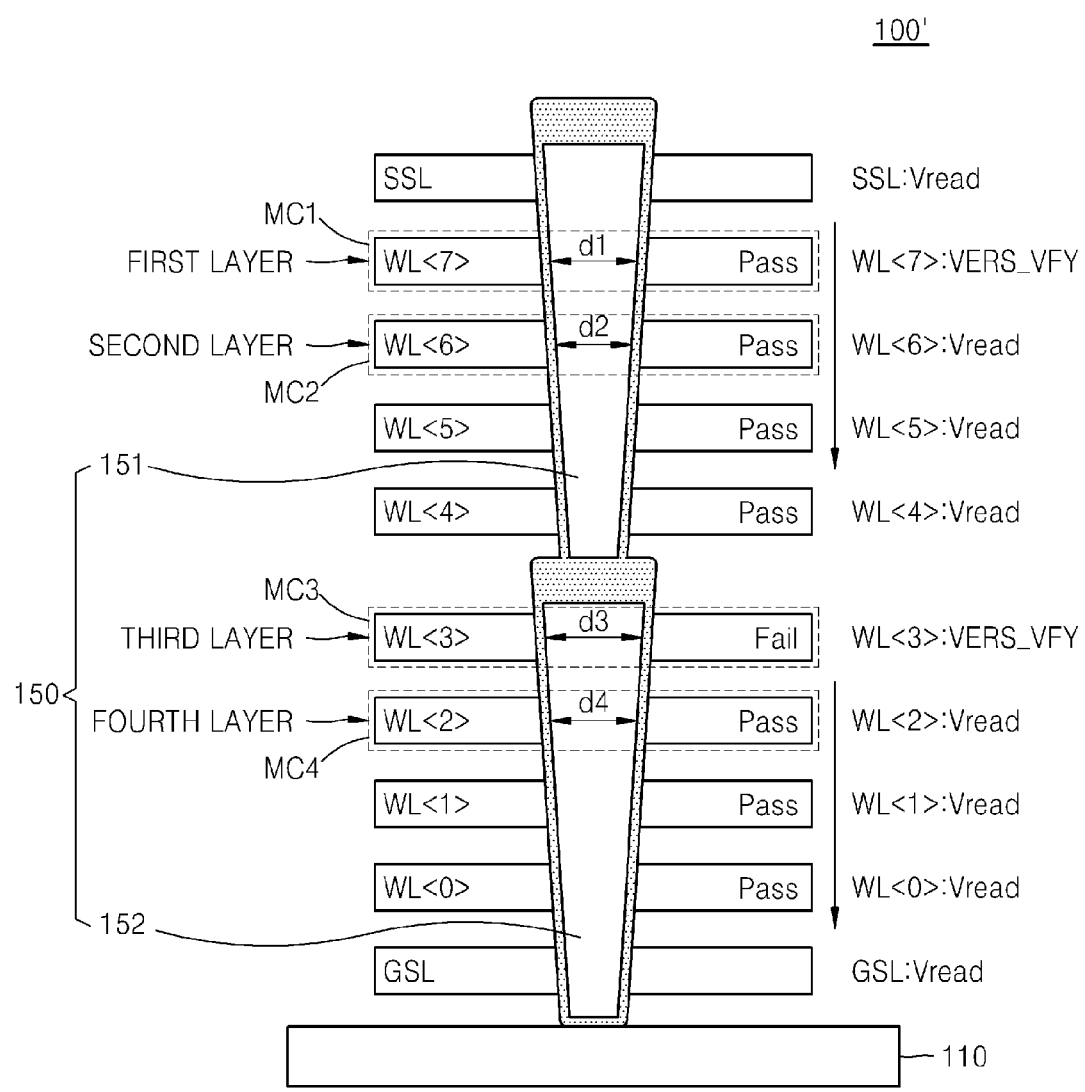
FIG. 6 is a cross-sectional view of a 3D semiconductor memory device according to another exemplary embodiment in accordance with principles of inventive concepts.
Figure 7:
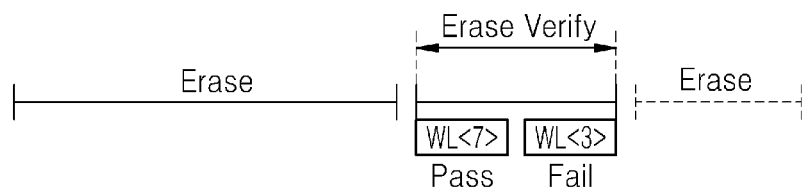
FIGS. 7 to 9 are timeline diagrams illustrating an exemplary embodiment of verifying operations of the 3D semiconductor memory device of FIG. 6.
Figure 9:
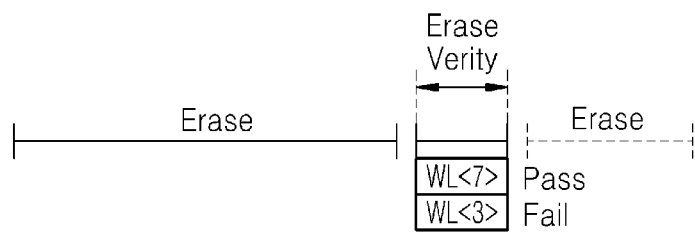

FIG. 6 is a cross-sectional view of an exemplary embodiment of a 3D semiconductor memory device 100' in accordance with principles of inventive concepts that features a modified example of memory cell string ST shown in FIG. 2. FIGS. 7 and 9 are time-lines that illustrate a verification operation of a 3D semiconductor memory device 100' in accordance with principles of inventive concepts.

Referring to FIG. 6, channel 150 may include an upper channel 151 and a lower channel 152. Lower channel 152 is disposed between upper channel 151 and substrate 110 and may be formed, for example, using etching and polysilicon-vapor deposition before forming upper channel 151, for example. After lower channel 152 is formed, upper channel 151 may be formed on lower channel 152 using etching and polysilicon-deposition, for example. A first layer and second layer may be disposed in upper channel 151, and a third layer and fourth layer may be disposed in lower channel 152.

In an exemplary embodiment in accordance with principles of inventive concepts, a width of lower channel 152 and a width of upper channel 151 may have the same profile. For example, a first diameter d1 of upper channel 151 disposed in first layer may be substantially the same as or similar to a third diameter d3 of lower channel 152 disposed in the third layer. Additionally, a second diameter d2 of upper channel 151 disposed in second layer may be substantially the same as or similar to a fourth diameter d4 of lower channel 152 disposed in the fourth layer.

Exemplary 3D semiconductor memory device 100' may include a first memory cell MC1 and a second memory cell MC2 which share the upper channel 151 and a third memory cell MC3 and a fourth memory cell MC4 which share the lower channel 152. As described with reference to FIG. 2, in an exemplary embodiment in accordance with principles of inventive concepts, first memory cell MC1 is disposed in the first layer of upper channel 151, and second memory cell MC2 is disposed in the second layer of upper channel 151, wherein the first diameter d1 of upper channel 151 disposed in the first layer may be greater than the second diameter d2 of upper channel 151 disposed in the second layer. During a verification operation for these memory cells, the controller (not shown) may apply a verifying voltage to first memory cell MC1 disposed in the first layer, before apply a verifying voltage to second memory cell MC2 disposed in the second layer as described above in order to, as described above, verify memory cells in order of descending probability of programming failure.

Lower channel 152 may also have the same (or similar) profile as upper channel 151, and third diameter d3 of lower channel 152 disposed in the third layer may be greater than fourth diameter d4 of lower channel 152 disposed in the fourth layer. In such an embodiment, the controller may perform a third step of applying a verifying voltage to the third memory cell MC3 disposed in the third layer, and then perform a fourth step of applying a verifying voltage to the fourth memory cell MC4 disposed in the fourth layer during the verifying operation. In an exemplary embodiment in accordance with principles of inventive concepts, a verification operation of the controller may be performed from the memory cell having a high failure rate to a low failure rate, by applying the verifying voltage to memory cells sequentially in the order from greatest channel diameter to least channel diameter, so that the operation speed may be increased.

Figure 8:
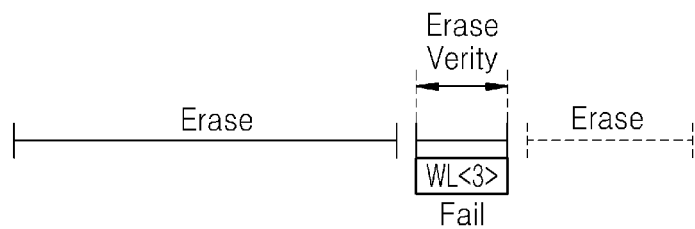

An exemplary embodiment of the operation of the controller of 3D semiconductor memory device 100' in accordance with principles of inventive concepts is shown in timelines of FIGS. 7 to 9 in more detail. Referring to FIGS. 7 and 8, the controller may sequentially perform a first step, i.e., a step of performing the erase verifying on a word line WL<7> of the first layer, and the third step, i.e., a step of performing the erase verifying on a word line WL<3> of the third layer, or may sequentially perform the third step and the first step, and then perform the second step and the fourth step. FIG. 7 shows that the controller sequentially performs the first step and the third step, and FIG. 8 shows that the controller sequentially performs the third step and the first step. Selectively, as shown in FIG. 9, the controller may simultaneously perform the first step and the third step, and then perform the second step and the fourth step.

For example, during the erase operation, the erase operation may not be normally performed in the third memory cell MC3 connected to word line WL<3>, but may be normally performed in the memory cells connected to the other word lines.

That is, as previously described, in an exemplary embodiment in accordance with principles of inventive concepts, a controller may perform a verification step after an erase step and, in order to accelerate the process, the sequence of verification steps may be carried out in an order that verifies the most-likely-to err cells first. As will be described in greater detail in the discussion related to the following figures, features within upper layers of a memory may render those layers more susceptible to errors than lower layers. And, therefore, in accordance with principles of inventive concepts, upper layers of memory may be verified, after a programming operation such as an erase operation for example, before lower layers are verified.

A verification operation in accordance with principles of inventive concepts of controller 120 may increase operation speed. Upper-level memory cells may be more susceptible to error because, in general, the diameter of a hole, of the channel connected to a upper word line, for example, WL<7> or WL<3>, is greater than that of the channel connected to a lower word line, for example, WL<6> or WL<2>. As the width of the channel increases, an electric field (E-field) applied to a tunneling oxide layer between the word line and the channel decreases. As the electric field decreases, charges stored in a charge storage layer may not be discharged. In this manner, an erase operation may not be properly performed. And, as a result, an 'erase failure' may more often occur in the channel connected to an upper word line, for example, WL<7> or WL<3>, than in the channel connected to the lower word line, for example, WL<6> or WL<2>, respectively.

If a verification operation were to be performed by applying a verifying voltage in the numerical order of the word lines, i.e., from the lower word line to the upper word line corresponding to a numerical order from WL<0> to WL<3>, or WL<4> to WL<7>, the highest probability of detecting an erase failure would lie in the upper-level layers and, as a result, a verification operation would require more time than a verification operation in accordance with principles of inventive concepts. That is, in an exemplary 3D semiconductor memory device 100 in accordance with principles of inventive concepts, a verification operation may be performed by applying the verifying voltage in reverse order of the word line, that is, from WL<3> to WL<0> or WL<7> to WL<4>, in other words, from the upper word line, for example, WL<3> or WL<7>, to the lower word line, for example, WL<2> or WL<6>, respectively; that is, in sequence from higher probability of programming failure, such as erase-failure, to lower probability of programming failure. Accordingly, in 3D semiconductor memory device 100, the verifying operation is first performed on a word line connected to the channel having a large width (an upper word line in this exemplary embodiment), so that the erase failure may be quickly detected to increase the operation speed.

In this case, referring to FIG. 7, the controller may detect the 'erase failure' by sequentially performing the first step and the third step. Meanwhile, referring to FIG. 8, the controller may detect the 'erase failure' by performing the third step. In addition, referring to FIG. 9, the controller may detect the 'erase failure' by simultaneously performing the first step and the third step.

Figure 10:
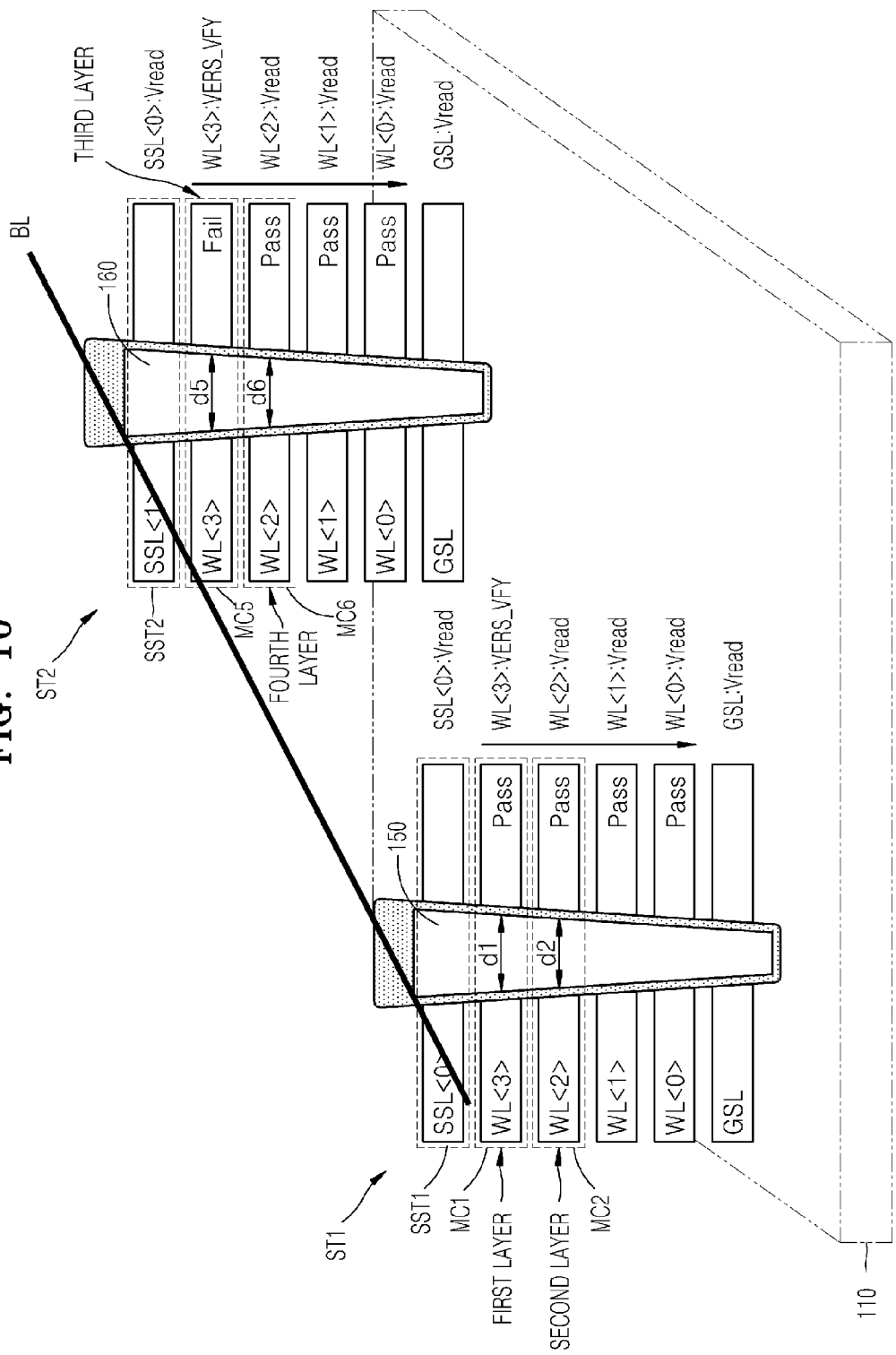
FIG. 10 is a cross-sectional view schematically illustrating a second portion of FIG. 1.
Figure 11:
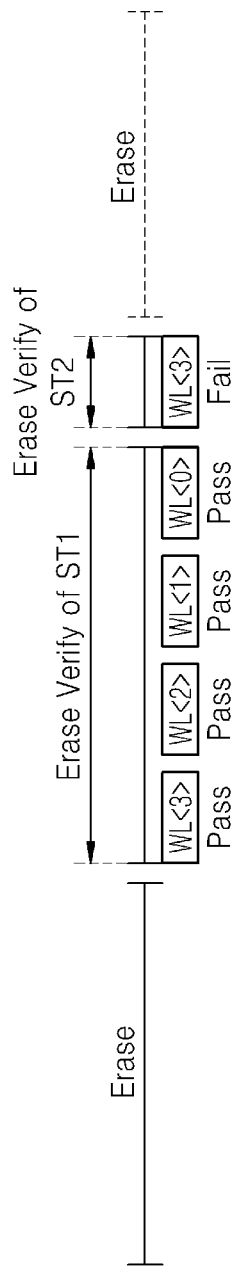
FIGS. 11 and 12 are timeline diagrams illustrating an exemplary embodiment of verifying operations of a 3D semiconductor memory device according to exemplary embodiments in accordance with principles of inventive concepts.
Figure 12:
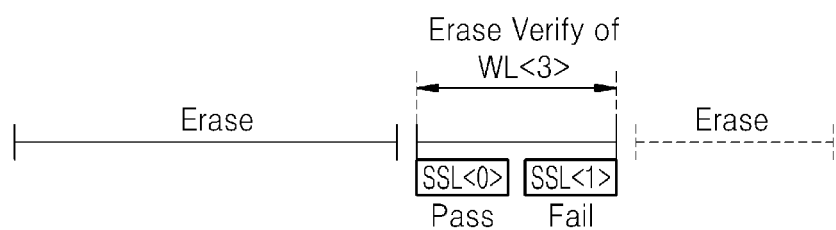

The exemplary embodiment of a 3D memory in accordance with principles of inventive concepts of FIG. 10 may be, for example, a cross-sectional view schematically illustrating a second portion P of FIG. 1. FIGS. 11 and 12 show verifying operations of a 3D semiconductor memory device 100 in accordance with principles of inventive concepts.

Referring to FIG. 10, 3D semiconductor memory device 100 may include a first memory cell string ST1 sharing a first channel 150 and a second memory cell string ST2 sharing a second channel 160. In this exemplary embodiment, first memory cell string ST1 and second memory cell string ST2 may respectively include a source selection transistor (hereinafter, referred to as a 'selection transistor'), memory cells, and a ground selection transistor, as described above.

First memory cell string ST1 may include a first memory cell MC1 disposed in a first layer of first channel 150 and a second memory cell MC2 disposed in a second layer of first channel 150. As described in the discussion related to FIG. 2, first diameter d1 of channel 150 disposed in the first layer may be greater than second diameter d2 of channel 150 disposed in the second layer. During verifying operations for these memory cells, controller 120 (FIG. 1) may apply a verifying voltage to first memory cell MC1 disposed in the first layer, and then apply a verifying voltage to the second memory cell MC2 disposed in the second layer as described above.

The second memory cell string ST2 may include a fifth memory cell MC5 disposed in the first layer of second channel 160 and a sixth memory cell MC6 disposed in the second layer of second channel 160. Fifth diameter d5 of second channel 160 disposed in the first layer may be greater than the sixth diameter d6 of second channel 160 disposed in the second layer. In this case, controller 120 (FIG. 1) may perform a fifth step of applying a verifying voltage to fifth memory cell MC5 disposed in the first layer, and then perform a sixth step of applying a verifying voltage to sixth memory cell MC6 disposed in the second layer during the verifying operation.

In an exemplary embodiment in accordance with principles of inventive concepts, first memory cell string ST1 may include a first selection transistor SST1 connected to first channel 150, and second memory cell string ST2 may include a second selection transistor SST2 connected to second channel 160. Bit lines BL may be connected to memory cells by turning on first selection transistor SST1 and/or the second selection transistor SST2. First memory cell MC1 and fifth memory cell MC5 disposed in the first layer may be connected to first word line WL<3>, and second memory cell MC2 and sixth memory cell MC6 disposed in the second layer may be connected to second word line WL<2>.

In the exemplary embodiment in accordance with principles of inventive concepts of FIG. 11, controller 120 (FIG. 1) may turn on first selection transistor SST1, perform the first step of applying a verifying voltage to first memory cell MCI disposed in the first layer, and perform the second step of applying a verifying voltage to second memory cell MC2 disposed in the second layer during the verifying operation. Then, controller 120 (FIG. 1) may turn on second selection transistor SST2, perform a fifth step of applying a verifying voltage to fifth memory cell MC5 disposed in the first layer, and perform a sixth step of applying a verifying voltage to sixth memory cell MC6 disposed in the second layer during the verifying operation.

That is, controller 120 (FIG. 1) may sequentially perform the first step, that is, a step of performing the erase verifying on word line WL<3>, the second step, that is, a step of performing the erase verifying on word line WL<2>, the fifth step, that is, a step of performing the erase verifying on word line WL<3>, and the sixth step, that is, a step of performing the erase verifying on word line WL<2>.

More particularly, in an exemplary embodiment in accordance with principles of inventive concepts the first step and the second step may be sequentially performed by turning on the first selection transistor SST1, and then applying the verifying voltage to the first word line WL<3> and the second word line WL<2>. In addition, the fifth step and the sixth step may be sequentially performed by turning on the second selection transistor SST2, and then applying the verifying voltage to the first word line WL<3> and the second word line WL<2>.

In this manner, controller 120 (FIG. 1) may perform a verifying operation on the memory cells in the first memory cell string ST1, for example, the first memory cell MC1 and the second memory cell MC2, and then the verifying operation on the memory cells in the second memory cell string ST2, for example, the fifth memory cell MC5 and the sixth memory cell MC6.

In an exemplary embodiment in accordance with principles of inventive concepts of FIG. 12, controller 120 (FIG. 1) may perform the first step of applying the verifying voltage to first memory cell MC1 disposed in the first layer by applying the verifying voltage to first word line WL<3>, and then perform the fifth step of applying the verifying voltage to fifth memory cell MC5 disposed in the first layer during the verifying operation. Then, controller 120 (FIG. 1) may perform the second step of applying the verifying voltage to second memory cell MC2 disposed in the second layer by applying the verifying voltage to second word line WL<2>, and then perform the sixth step of applying the verifying voltage to sixth memory cell MC6 disposed in the second layer during the verifying operation.

That is, controller 120 (FIG. 1) may sequentially perform the first step, that is, a step of performing the erase verifying on word line WL<3>, the fifth step, that is, a step of performing the erase verifying on word line WL<3>, the second step, that is, a step of performing the erase verifying on word line WL<2>, and the sixth step, that is, a step of performing the erase verifying on word line WL<2>. In such an exemplary embodiment verifying operations may be understood as performing the verifying operation on the first word line WL<3> and the verifying operation on the second word line WL<2>. In particular, the verifying operation may be performed on a plurality of memory cells, for example, the first and fifth memory cells MC1 and MC5, connected to a single word line, for example, the first word line WL<3>, by simultaneously turning on a plurality of source selection lines SSL<0> and SSL<1>. As will be described in greater detail in the discussion related to FIG. 15, in an exemplary embodiment in accordance with principles of inventive concepts, a plurality of source selection lines may be simultaneously selected.

In the exemplary embodiment of FIG. 12, the first step and the fifth step may be sequentially performed by applying the verifying voltage to first word line WL<3>, and then sequentially turning on first selection transistor SST1 and second selection transistor SST2. In addition, the second step and the sixth step may be sequentially performed by applying the verifying voltage to second word line WL<2>, and then sequentially turning on first selection transistor SST1 and second selection transistor SST2.

As a result, controller 120 (FIG. 1) may perform the verifying operation on the memory cells connected to first word line WL<3>, for example, the first memory cell MC1 and the fifth memory cell MC5, and then perform the verifying operation on memory cells connected to second word line WL<2>, for example, second memory cell MC2 and sixth memory cell MC6.

Figure 13:
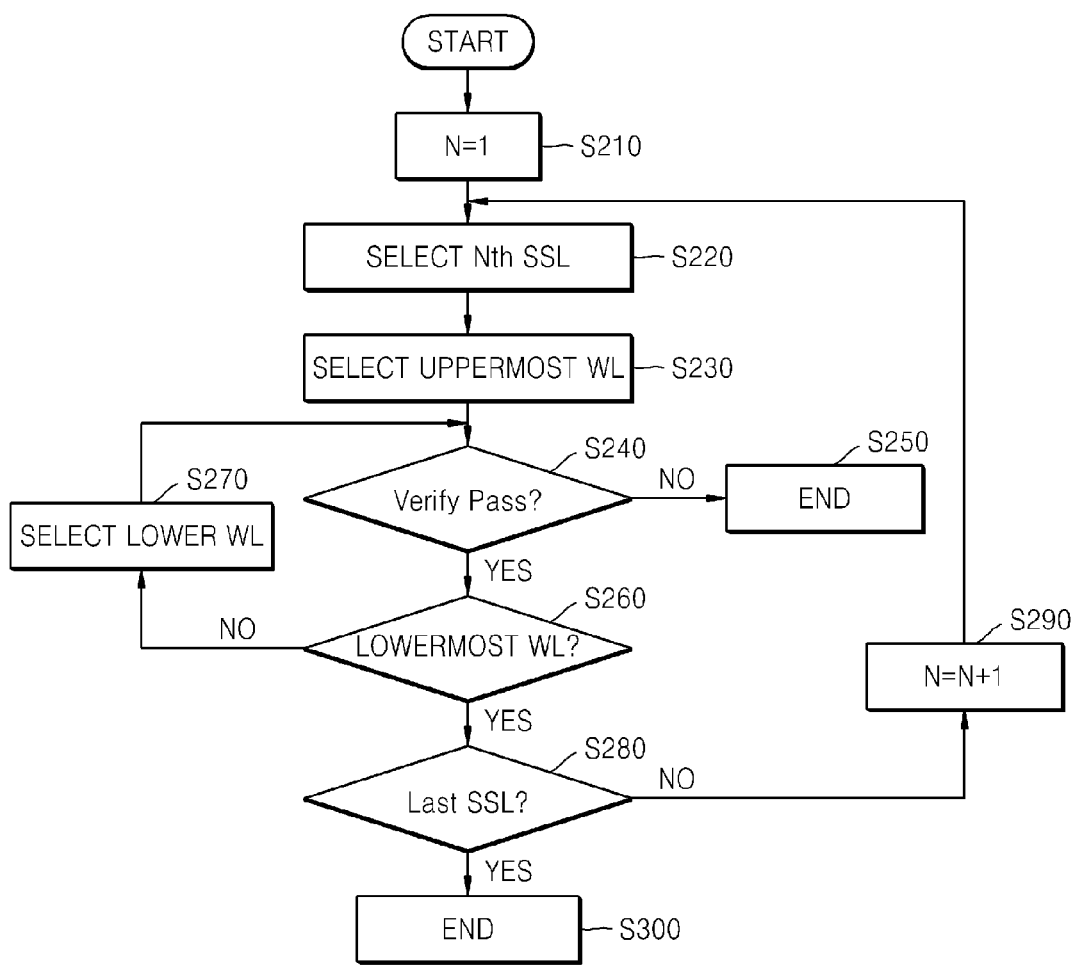
FIG. 13 is a flow chart schematically illustrating a method of operating a 3D semiconductor memory device in accordance with principles of inventive concepts.

FIG. 13 is a flow chart schematically illustrating a method of operating a 3D semiconductor memory device in an exemplary embodiment of a 3D memory device in accordance with principles of inventive concepts. The method of operating the 3D semiconductor memory device may correspond to the verifying operation of the 3D semiconductor memory device shown in FIG. 11, for example.

Referring to FIG. 13, N=1 (S210), and an $N^{th}$ source selection line is selected (S220). Then, an uppermost word line, for example, WL<3> is selected, and a verifying operation (S240) is performed on memory cells MC1 or MC5 (FIG. 10) connected to an uppermost word line by applying a verifying voltage to an uppermost word line. If the verifying operation is not passed, that is, if the memory cell fails the test, that indicates a programming failure, such as an 'erase failure', so the verifying operation is ended (S250).

If the verifying operation is passed, the process determines whether the selected word line is the lowermost word line (S260). If the selected word line is not the lowermost word line, a lower word line is selected (S270). Then, the verifying operation (S240) is repeated on the memory cell connected to the selected lower word line.

If the selected word line is the lowermost word line, it is determined whether the $N^{th}$ source selection line is the last source selection line (S280). If the $N^{th}$ source selection line is not the last source selection line, N is increased (S290), and the verifying operation is repeated on memory cells connected to the $(N+1)^{th}$ source selection line. If the $N^{th}$ source selection line is the last source selection line, all verifying operations are passed. Thus, the verifying operation is ended as a programming success, such as an 'erase success' (S300).

Figure 14:
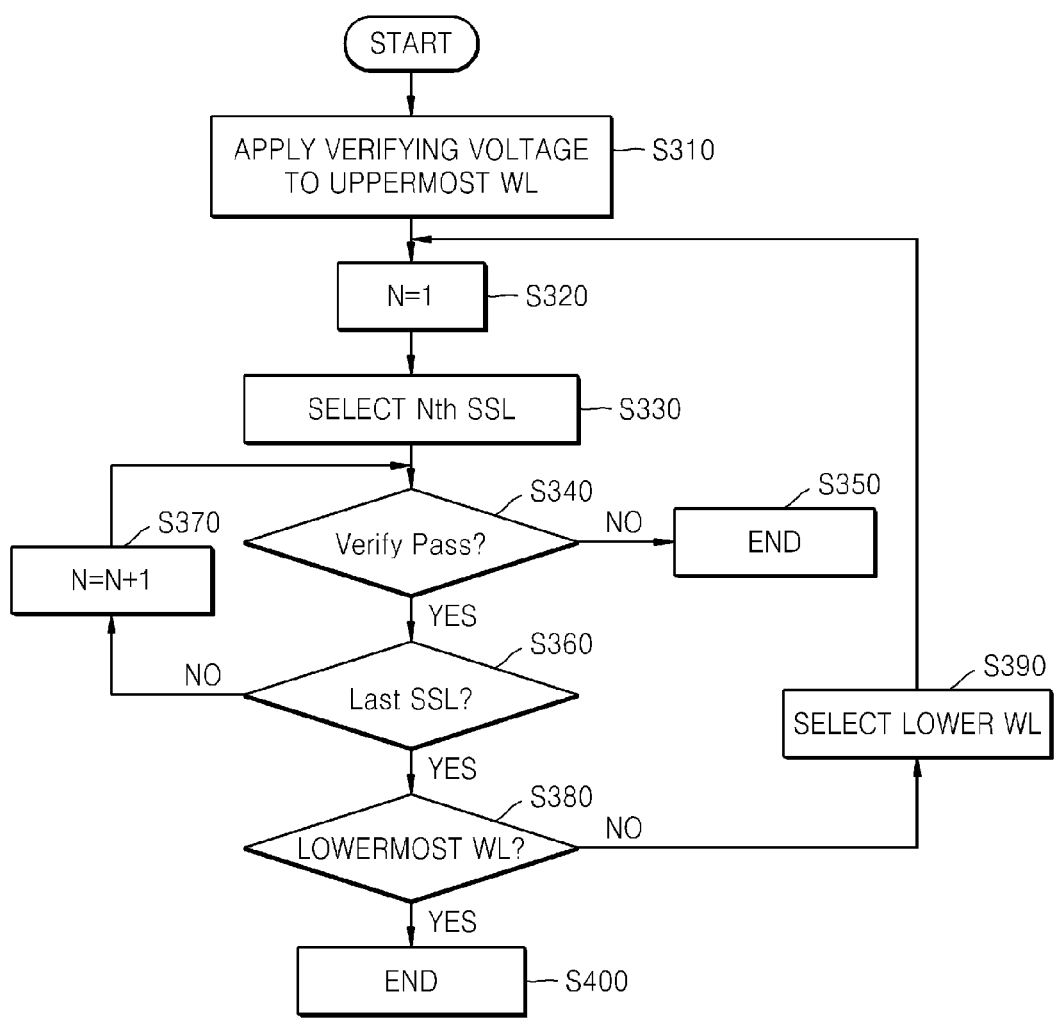
FIGS. 14 and 15 are flow charts schematically illustrating a method of operating a 3D semiconductor memory device in accordance with principles of inventive concepts.

FIG. 14 is a flow chart schematically illustrating a method of operating a 3D semiconductor memory device according to another exemplary embodiment in accordance with principles of inventive concepts. The method of operating the 3D semiconductor memory device may correspond to the verifying operation of the 3D semiconductor memory device shown in FIG. 12, for example.

Referring to FIG. 14, a verifying voltage is first applied to the uppermost word line, for example, WL<3> (FIG. 10) (S310). Then, N=1 (S320), and an $N^{th}$ source selection line is selected (S330). Thus, a verifying operation on memory cell MC1 or MC5 (FIG. 10) connected to the uppermost word and the $N^{th}$ source line and line may be performed (S340). If the verifying operation is not passed, that is, if the memory cell is not programmed appropriately, that indicates a programming failure, such as an 'erase failure', so that the verifying operation is ended (S350).

If the verifying operation is passed, the process determines whether the selected $N^{th}$ source selection line is the last source selection line (S360). If the $N^{th}$ source selection line is not the last source selection line, N is increased (S370), and the verifying operation is repeated on the $(N+1)^{th}$ source selection line and the memory cell connected to the uppermost word line (S340).

If the $N^{th}$ source selection line is the last source selection line, the process determines whether the selected word line is the lowermost word line (S380). If the selected word line is not the lowermost word line, a lower word line is selected (S390). Then, the verifying operation (S340) is repeated on the memory cell connected to the selected lower word line. If the selected word line is the lowermost word line, all verifying operations are passed. Thus, the verifying operation is ended as a programming success, such as an 'erase success' (S400).

Figure 15:
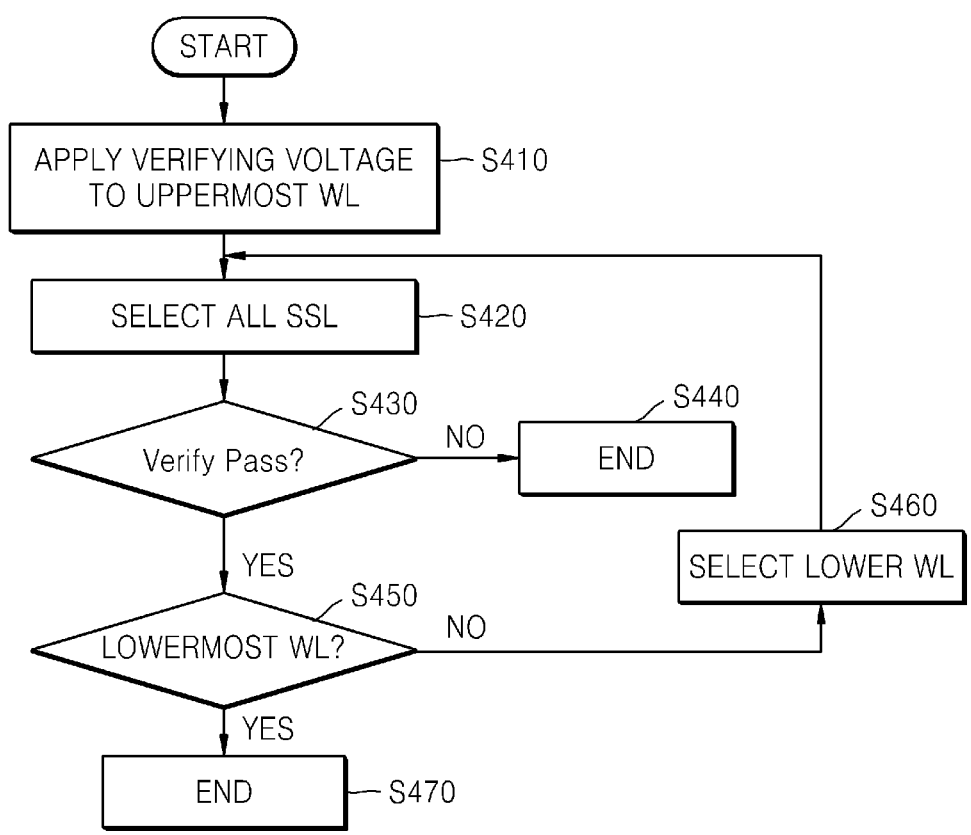

FIG. 15 is a flow chart schematically illustrating an exemplary method of operating a 3D semiconductor memory device in accordance with principles of inventive concepts. This method of operating the 3D semiconductor memory device may be thought of as a modification of the method of FIG. 14. FIG. 15 schematically illustrates the method of operating the 3D semiconductor memory device including performing the verifying operation of each of the word lines on all source selection lines SSL.

Referring to FIG. 15, a verifying voltage is first applied to the uppermost word line, for example, WL<3> (FIG. 10) (S410). Then, all source selection lines, i.e., SSL<0> and SSL<1> (FIG. 10) are selected (S420). Accordingly, verifying operations may be performed on all memory cells MC1 and MC5 connected to the uppermost word line (S430). If the memory cell does not pass the verifying operation, it indicates a programming failure, such as an 'erase failure', so that the verifying operation is ended (S440).

If the memory cell passes the verifying operation, the process determines whether the selected word line is the lowermost word line (S450). If the selected word line is not the lowermost word line, a lower word line is selected (S460). Then, the verifying operation (S430) is repeated on the memory cell connected to the selected lower word line. If the selected word line is the lowermost word line, all verifying operations are passed. Thus, the verifying operation is ended as a programming success, such as an 'erase success' (S470).

Figure 16:
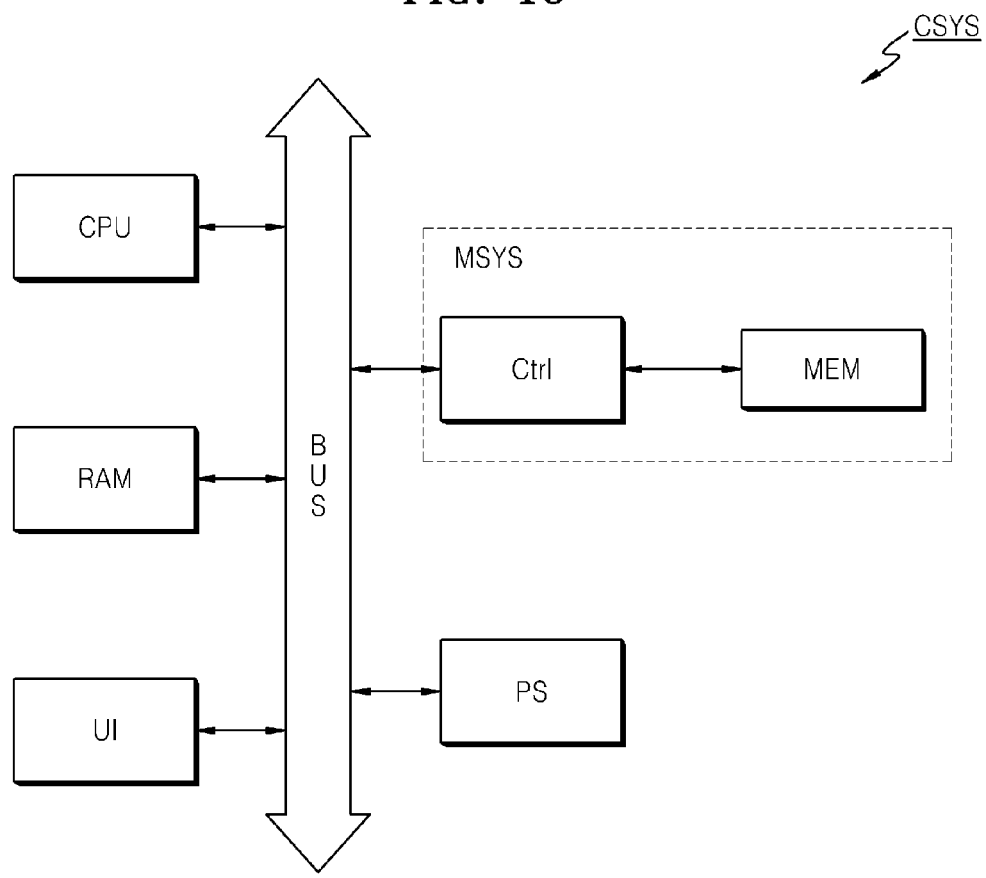
FIG. 16 is a block diagram of a computing system apparatus in accordance with principles of inventive concepts.

FIG. 16 is a block diagram of a computing system such as may employ a memory in accordance with principles of inventive concepts.

A computing system apparatus CSYS according to an exemplary embodiment includes a CPU (central processing unit), a user interface UI, and a semiconductor memory system MSYS, which are electrically connected to a bus BUS. The semiconductor memory system MSYS includes a memory controller Ctrl and a memory device MEM. N-bit data, wherein N is 1 or an integer greater than 1, which is processed or will be processed by the processor CPU, is stored in the memory device MEM via the memory controller Ctrl. The memory device MEM of the semiconductor memory system MSYS of FIG. 18 may include a memory device in accordance with principles of inventive concepts, such as the 3D semiconductor memory device shown in FIG. 1. Thus, the operation speed of the computing system apparatus CSYS of FIG. 18 may be increased by the memory device MEM.

The computing system apparatus CSYS according to the current embodiment may further include a power supply apparatus PS. Also, if the memory device MEM is a flash memory device including the 3D semiconductor memory device as shown in FIG. 1, the computing system apparatus CSYS according to the current embodiment may further include a volatile memory device, for example, RAM.

If the computing system apparatus CSYS according to the current embodiment is a mobile apparatus, a battery for supplying a driving voltage of the computing system apparatus CSYS and a modem such as a baseband chipset may be additionally provided. Also, an application chipset, a camera image processor CIS, and mobile DRAM may further be provided to the computing system apparatus CSYS according to an exemplary embodiment; a detailed description thereof will be omitted.

Figure 17:
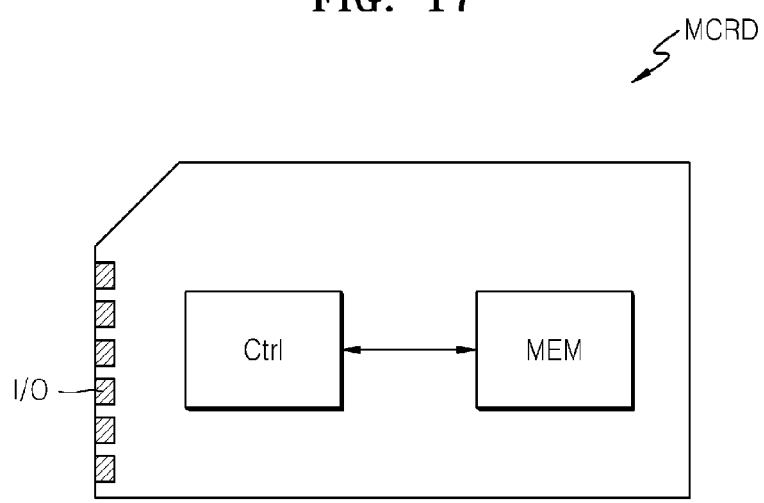
FIG. 17 is a block diagram of a memory card in accordance with principles of inventive concepts.

FIG. 17 is a block diagram of a memory card which may include a memory in accordance with principles of inventive concepts.

Referring to FIG. 17, the memory card MCRD according to the current embodiment includes a memory controller Ctrl and a memory device MEM. The memory controller Ctrl controls data to be written on or read from the semiconductor memory device MEM, in response to a request of an external host (not shown), received through an input and output unit I/O. Also, when the memory device MEM of FIG. 17 is a flash memory device, the memory controller Ctrl controls an erase operation on the memory device MEM. In order to perform such control operations, the memory controller Ctrl of the memory card MCRD according to an exemplary embodiment in accordance with principles of inventive concepts may include RAM and interface units (not shown), which interface with hosts and the semiconductor memory device MEM. The memory card MCRD may include a 3D semiconductor memory device in accordance with principles of inventive concepts, such as shown in FIG. 1. The operation speed of the memory card MCRD of FIG. 17 may be increased as a result of employing a verification process in accordance with principles of inventive concepts.

The memory card MCRD of FIG. 17 may be a compact flash card (CFC), a microdrive, a smart media card (SMC), a multimedia card (MMC), a security digital card (SDC), a memory stick, or a universal serial bus (USB) flash memory driver, for example.

Figure 18:
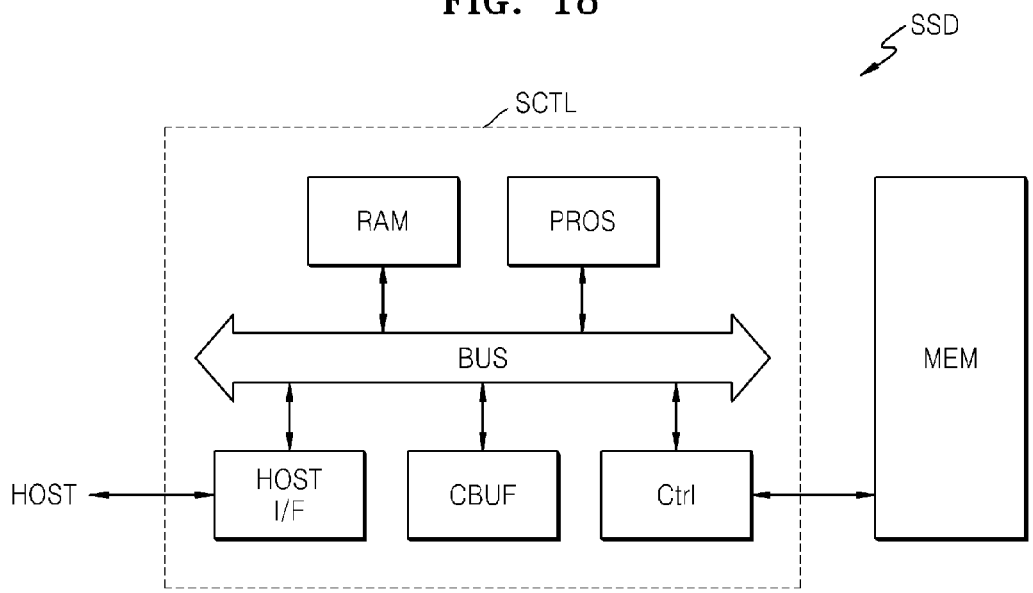
FIG. 18 is a block diagram of a solid state drive in accordance with principles of inventive concepts.

FIG. 18 is a block diagram of a solid state drive (SSD) according to an exemplary embodiment in accordance with principles of inventive concepts.

Referring to FIG. 18, the SSD according to an exemplary embodiment includes a SSD controller SCTL and a memory device MEM. The SSD controller SCTL may include a processor PROS, RAM, a cache buffer CBUF, and a memory controller Ctrl, which connect to a bus BUS. The processor PROS controls the memory controller Ctrl to transmit and receive data to and from the memory device MEM in response to a request (command, address or data) of a host (not shown). The processor PROS and the memory controller Ctrl of the SSD according to the current embodiment may be realized in one ARM processor, for example. Data for the processor PROS may be loaded in the RAM.

A host interface HOST I/F may transmit a received request of the host to the processor PROS, or transmit received data from the memory device MEM to the host. The host interface HOST I/F may interface with the host by using various interface protocols such as USB, man machine communication (MMC), peripheral component interconnect-express (PCI-E), serial advanced technology attachment (SATA), parallel advanced technology attachment (PATA), small computer system interface (SCSI), enhanced small device interface (ESDI), and intelligent drive electronics (IDE), for example. The data that is received from or to be transmitted to the memory device MEM may be temporarily stored in the cache buffer CBUF. The cache buffer CBUF may be an SRAM.

The memory device MEM installed in the SSD may be a 3D semiconductor memory device in accordance with principles of inventive concepts as shown in FIG. 1. Thus, the operation speed of the SSD of FIG. 18 may be increased.

Figure 19:
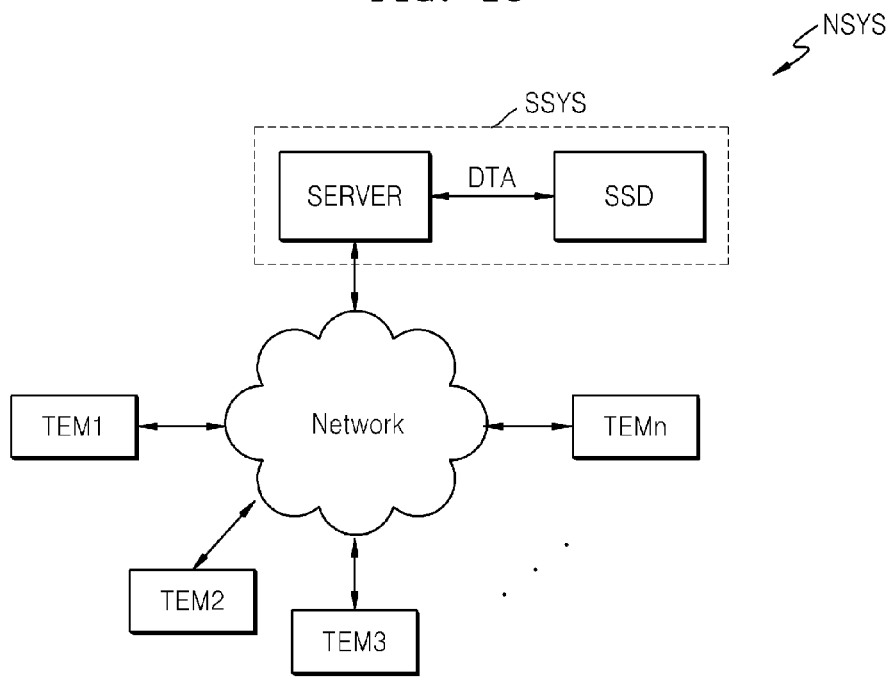
FIG. 19 is a block diagram of a server system and a network system including a solid state drive in accordance with principles of inventive concepts.

FIG. 19 is a block diagram of a server system and a network system including a SSD which may include a memory in accordance with principles of inventive concepts.

Referring to FIG. 19, the network system NSYS according to the current embodiment may include a server system SSYS and a plurality of terminals TEM1 to TEMn which are electrically connected through a network. The server system SSYS according to the current embodiment may include a server SERVER and the SSD, wherein the server SERVER processes requests received from the plurality of terminals TEM1 to TEMn and the SSD stores data that corresponds to the requests received from the plurality of terminals TEM1 to TEMn. SSD may be an SSD in accordance with principles of inventive concepts, such as the SSD of FIG. 18. Accordingly, the operation speed of the server system SSYS and the network system NSYS may be accelerated by performing a verification operation in accordance with principles of inventive concepts.

Elements illustrated in the drawings, which are provided for clear understanding of the inventive concept, should be regarded as illustrative only. It should be understood that the elements may be modified in various forms other than the illustrated ones. The same reference numerals refer to the same constitutional elements throughout the drawings.

While the inventive concept has been particularly shown and described with reference to exemplary embodiments thereof, it will be understood that various changes in form and details may be made therein without departing from the spirit and scope of the following claims.

What is claimed is:

1. A 3D semiconductor memory device including a plurality of memory cell strings, the 3D semiconductor memory device comprising:
    a substrate;
    a first channel that extends from the substrate in a direction transverse the substrate;
    a first memory cell that is disposed in a first layer of the first channel;
    a second memory cell that is disposed in a second layer of the first channel; and
    a controller that controls the first memory cell and the second memory cell,
    wherein the controller performs a first step of applying a verifying voltage to the first memory cell disposed in the first layer and a second step of applying a verifying voltage to the second memory cell disposed in the second layer,
    a first diameter of the first channel disposed in the first layer is greater than a second diameter of the first channel disposed in the second layer, and
    the second step is performed only when the verifying operation of the first step is passed.

2. The 3D semiconductor memory device of claim 1, wherein the second layer is disposed between the first layer and the substrate.

3. The 3D semiconductor memory device of claim 1, wherein the first and second steps are performed after performing erase operations of the first and second memory cells.

4. The 3D semiconductor memory device of claim 3, wherein the erase operation comprises applying an erase voltage to the first and second memory cells before the first and second steps.

5. The 3D semiconductor memory device of claim 1, further comprising:
    a third memory cell that is disposed in a third layer of the first channel; and
    a fourth memory cell that is disposed in a fourth layer of the first channel,
    wherein the first channel comprises a upper channel and a lower channel disposed between the upper channel and the substrate,
    the first and second layers are disposed in the upper channel,
    the third and fourth layers are disposed in the lower channel,
    the controller performs a third step of applying a verifying voltage to the third memory cell disposed in the third layer, and a fourth step of applying a verifying voltage to the fourth memory cell disposed in the fourth layer,
    a third diameter of the lower channel disposed in the third layer is greater than a fourth diameter of the lower channel disposed in the fourth layer, and
    the fourth step is performed after the third step.

6. The 3D semiconductor memory device of claim 5, wherein the fourth layer is disposed between the third layer and the substrate.

7. The 3D semiconductor memory device of claim 5, wherein the controller sequentially performs the first step and the third step, or the third step and the first step, and then performs the second step and the fourth step.

8. The 3D semiconductor memory device of claim 5, wherein the controller simultaneously performs the first step and the third step, and then the second step and the fourth step.

9. The 3D semiconductor memory device of claim 8, wherein the first diameter is substantially the same as the third diameter, and the second diameter is substantially the same as the fourth diameter.

10. The 3D semiconductor memory device of claim 1, further comprising:

a second channel that extends from the substrate in a direction transverse the substrate;

a fifth memory cell that is disposed in the first layer of the second channel; and a sixth memory cell that is disposed in the second layer of the second channel, wherein the controller performs a fifth step of applying a verifying voltage to the fifth memory cell disposed in the first layer, and a sixth step of applying a verifying voltage to the sixth memory cell disposed in the second layer, a fifth diameter of the second channel disposed in the first layer is greater than a sixth diameter of the second channel disposed in the second layer, and the sixth step is performed after the fifth step.

11. The 3D semiconductor memory device of claim 10, wherein the controller sequentially performs the first step, the second step, the fifth step, and the sixth step.

12. The 3D semiconductor memory device of claim 11, further comprising:

a first word line that is connected to the first memory cell and the fifth memory cell;

a second word line that is connected to the second memory cell and the sixth memory cell;

a first selection transistor that is connected to the first channel; and a second selection transistor that is connected to the second channel, wherein the first and second steps are performed by turning on the first selection transistor, and applying a verifying voltage to the first and second word lines, and the fifth and sixth steps are sequentially performed by turning on the second selection transistor and applying a verifying voltage to the first and second word lines.

13. The 3D semiconductor memory device of claim 10, wherein the controller sequentially performs the first step, the fifth step, the second step, and the sixth step.

14. The 3D semiconductor memory device of claim 13, further comprising:

a first word line that is connected to the first memory cell and the fifth memory cell;

a second word line that is connected to the second memory cell and the sixth memory cell;

a first selection transistor that is connected to the first channel; and a second selection transistor that is connected to the second channel, wherein the first and fifth steps are performed by applying a verifying voltage to the first word line, and sequentially turning on the first selection transistor and the second selection transistor, and the second and sixth steps are performed by applying a verifying voltage to the second word line, and sequentially turning on the first selection transistor and the second selection transistor.

15. A 3D semiconductor memory device including a plurality of memory cell strings, the 3D semiconductor memory device comprising:

a substrate;

a first channel that extends from the substrate in a direction transverse the substrate;

a first memory cell that is disposed in a first layer of the first channel;

a second memory cell that is disposed in a second layer of the first channel; and a controller that controls the first memory cell and the second memory cell, wherein the controller performs a first step of applying a verifying voltage to the first memory cell disposed in the first layer and a second step of applying a verifying voltage to the second memory cell disposed in the second layer, the second layer is disposed between the first layer and the substrate, and the second step is performed only when the verifying operation of the first step is passed.

16. A method in a semiconductor memory, comprising:

Verifying a programming step in a memory cell in which the programming step is more likely to have failed; and subsequently verifying the programming step in a memory cell in which the programming step is less likely to have failed;

wherein the semiconductor memory is a 3D semiconductor memory device including a plurality of memory cell strings, the 3D semiconductor memory device comprising:

a substrate;

a first channel that extends from the substrate in a direction transverse from the substrate;

a first memory cell that is disposed in a first layer of the first channel; and a second memory cell that is disposed in a second layer of the first channel, wherein a first diameter of the first channel disposed in the first layer is greater than a second diameter of the first channel disposed in the second layer, wherein the verifying of a programming step is performed on a memory cell in the first layer before a memory cell in the second layer.

17. The method of claim 16 wherein the verifying of a programming step is the verifying of an erasing step.

18. The method of claim 17 wherein the verifying of a memory cell in the second layer is not performed if the verifying of a memory cell in the first layer indicates the programming of the memory cell in the first layer is a failure.

19. The method of claim 18 wherein the step of verifying is performed on a 3D FLASH memory device.

* * * * *